(12) United States Patent
Benwadih et al.

(10) Patent No.: US 11,462,705 B2
(45) Date of Patent: Oct. 4, 2022

(54) PHOTODETECTOR WITH CHARGE CARRIER COLLECTION LAYER COMPRISING FUNCTIONALIZED NANOWIRES

(71) Applicant: COMMISSARIAT A L'ENERGIE ATOMIQUE ET AUX ENERGIES ALTERNATIVES, Paris (FR)

(72) Inventors: Mohammed Benwadih, Champagny sur Marne (FR); Olivier Haon, Saint Etienne de Crossey (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 672 days.

(21) Appl. No.: 16/466,915

(22) PCT Filed: Dec. 6, 2017

(86) PCT No.: PCT/FR2017/053418
§ 371 (c)(1),
(2) Date: Sep. 3, 2019

(87) PCT Pub. No.: WO2018/104664
PCT Pub. Date: Jun. 14, 2018

(65) Prior Publication Data
US 2019/0386237 A1 Dec. 19, 2019

(30) Foreign Application Priority Data
Dec. 8, 2016 (FR) ...................................... 1662165

(51) Int. Cl.
*H01L 51/44* (2006.01)
*H01L 51/50* (2006.01)
(Continued)

(52) U.S. Cl.
CPC ........... *H01L 51/5072* (2013.01); *H01B 1/02* (2013.01); *H01L 31/022466* (2013.01);
(Continued)

(58) Field of Classification Search
CPC ......... H01L 51/5072; H01L 31/022466; H01L 51/4206; H01L 51/441; H01B 1/02;
(Continued)

(56) References Cited

U.S. PATENT DOCUMENTS

2004/0178325 A1  9/2004 Forrest et al.
2007/0176165 A1  8/2007 Forrest et al.
(Continued)

FOREIGN PATENT DOCUMENTS

FR        2 977 080 A1    12/2012
WO    WO 2011/106438 A1    9/2011
WO    WO-2012137037 A1 * 10/2012 ....... H01L 31/02168

OTHER PUBLICATIONS

International Search Report dated Feb. 26, 2018 in PCT/FR2017/053418 filed Dec. 6, 2017.
(Continued)

*Primary Examiner* — David Vu
*Assistant Examiner* — Brandon C Fox
(74) *Attorney, Agent, or Firm* — Oblon, McClelland, Maier & Neustadt, L.L.P.

(57) ABSTRACT

A photodetector is provided, including an active layer configured to generate charge carriers of a first type and of a second type by absorption of electromagnetic radiation; a first electrode configured to collect the charge carriers of the first type; and a second electrode configured to collect the charge carriers of the second type, the first electrode including a layer configured to collect the charge carriers of the first type, the layer including self-assembled monolayers, and nanowires comprising metal and functionalized by the
(Continued)

self-assembled monolayers, the self-assembled monolayers of the layer are configured to functionalize the nanowires and to modify a work function of a material forming the nanowires. A method for manufacturing a photodetector and an electrode for a photodetector are also provided.

12 Claims, 3 Drawing Sheets

(51) Int. Cl.
  *H01L 51/42* (2006.01)
  *H01B 1/02* (2006.01)
  *H01L 31/0224* (2006.01)
  *H05K 1/02* (2006.01)
  *H05K 1/09* (2006.01)
  *B82Y 30/00* (2011.01)

(52) U.S. Cl.
  CPC ........ *H01L 51/4206* (2013.01); *H01L 51/441* (2013.01); *H05K 1/0274* (2013.01); *H05K 1/09* (2013.01); *B82Y 30/00* (2013.01); *H05K 2201/0108* (2013.01); *H05K 2201/0302* (2013.01)

(58) Field of Classification Search
  CPC .................. H05K 1/0274; H05K 1/09; H05K 2201/0108; H05K 2201/0302; B82Y 30/00; Y02E 10/549; Y02P 70/50
  USPC .......................................................... 257/40
  See application file for complete search history.

(56) References Cited

U.S. PATENT DOCUMENTS

| | | | |
|---|---|---|---|
| 2014/0110695 A1 | 4/2014 | Benwadih | |
| 2014/0319461 A1* | 10/2014 | Park | H01L 27/305 257/14 |
| 2015/0008016 A1 | 1/2015 | Poon | |
| 2015/0014025 A1 | 1/2015 | Poon | |
| 2015/0083466 A1 | 3/2015 | Simonato et al. | |
| 2015/0162112 A1 | 6/2015 | Poon | |
| 2015/0235728 A1 | 8/2015 | Poon | |
| 2017/0077429 A1* | 3/2017 | Huang | H01L 51/426 |
| 2018/0111833 A1* | 4/2018 | Han | C01B 32/16 |

OTHER PUBLICATIONS

Tatara, S. et al., "Surface properties of substituted-benzenethiol monolayers on gold and silver: Work function, wettability, and surface tension," Japanese Journal of Applied Physics, vol. 55, No. 03DD02, 2016, 6 pages.

Jesper, M. et al., "Dipolar SAMs Reduce Charge Carrier Injection Barriers in n-Channel Organic Field Effect Transistors," pubs.acs.org/Langmuir, 2015, No. 31, p. 10303-10309.

Jørgensen, M. et al., "Stability/degradation of polymer solar cells," Solar Energy Materials & Solar Cells, vol. 92, 2008, pp. 686-714.

Li, G. et al., "High-efficiency solution processable polymer photovoltaic cells by self-organization of polymer blends," Nature materials, vol. 4, Nov. 2005, www.nature.com/naturematerials, pp. 864-868.

* cited by examiner

PHOTODETECTOR WITH CHARGE CARRIER COLLECTION LAYER COMPRISING FUNCTIONALIZED NANOWIRES

FIELD OF THE INVENTION

The invention relates to the field of photodetectors, notably organic photodetectors, and more particularly electrodes enabling the collection of charge carriers within an active layer of the photodetector.

PRIOR ART

In the field of photodetectors, there are organic photodetectors, for example organic photodiodes, which are systems consisting of semiconductor materials that have the ability to convert electromagnetic radiation, notably light energy, into electrical energy. This conversion is due to the photovoltaic effect of the material used that makes it possible to capture the energy of the photons received to release charge carriers from the valence band to the conduction band. These charge carriers, also referred to as electrons, or holes, depending on the associated charge, may then be collected by corresponding electrodes so as to generate electrical energy.

Within the context of organic photodiodes, there are two architectures respectively referred to as direct architecture or inverted architecture.

In direct architecture, the organic photodiode may be formed by the following stack formed starting from a transparent substrate: an anode intended to recover the holes photogenerated in an active layer, the active layer and the cathode. The anode may comprise a hole transport layer in contact with the substrate and notably formed of ITO (indium tin oxide) and a hole collection layer made of PEDOT:PSS which corresponds to poly(3,4-ethylenedioxythiophene): sodium poly(styrene sulfonate).

In inverted architecture, there is, starting from the substrate, the stack of the following successive elements starting from the substrate: a cathode comprising an electron transport layer, notably made of ITO, and an electron collection layer, notably made of zinc oxide (ZnO) or of titanium oxide (TiOx), the active layer, and the anode comprising a hole collection layer made of PEDOT:PSS in contact with the active layer and a hole transport layer.

The role of this PEDOT:PSS layer is to make a contact with the active layer having a work function aligned with the HOMO (acronym for highest occupied molecular orbital) of the electron donor. Although it is a good candidate for collecting holes, PEDOT:PSS has certain drawbacks: it is very sensitive to the method used for depositing it, in the presence of water it becomes an acid, and it is not homogeneous since the formation of holes due to a dewetting during the deposition is observed. Furthermore, when it is deposited on the active layer (notably when the latter comprises P3HT and PCBM), the solvent that allows the deposition of the PEDOT:PSS degrades the active layer. P3HT is the abbreviation for poly(3-hexylthiophene), or even poly(3-hexylthiophene-2,5-diyl), it is a p-type (electron donor) semiconducting polymer. PCBM is a fullerene, it is preferably the abbreviation for [6,6]-phenyl-$C_{61}$-methyl butanoate, it is an n-type (electron acceptor) organic semiconductor. A PCBM of $C_{60}$ or $C_{70}$ type may also be used, those skilled in the art know how to choose the PCBM when the type thereof is indicated to them. Certain drawbacks linked to the use of PEDOT:PSS are described in the document "Stability/degradation of polymer solar cells" by Mikkel Jørgensen et al., published in *Solar Energy Materials & Solar Cells,* 92 (2008) pages 686-714. It is therefore understood that there is a need to find an alternative to PEDOT:PSS as hole collection layer within a photodetector.

Furthermore, generally, the cathode will be chosen so that its work function is aligned with the LUMO (acronym for lowest unoccupied molecular orbital) of the electron acceptor.

It is understood from what has been stated above that the hole collection layer, and the same principle may also be applied for the electron collection layer, should preferentially satisfy all or some of the following conditions/needs:
- have an electrical conductivity sufficient to limit the series resistance of the photodetector notably when the latter is a diode,
- have a work function suitable for the active layer used,
- have a stability to the deposition conditions (chemical compatibility with the solvents),
- have an environmental stability for example with respect to moisture or light.

This leads to a need to develop an electrode intended for collecting charge carriers and compatible with the active layer of the photodetector. Furthermore, there is also a need to find alternative solutions to the existing solution.

SUBJECT OF THE INVENTION

The objective of the invention is a photodetector meeting at least in part to the needs listed above.

This objective is moved toward thanks to a photodetector comprising an active layer configured so as to generate charge carriers of a first type and of a second type by absorption of electromagnetic radiation, a first electrode capable of collecting the charge carriers of the first type and a second electrode capable of collecting the charge carriers of the second type, this photodetector being characterized in that the first electrode comprises a layer for collecting charge carriers of the first type comprising: self-assembled monolayers, and nanowires comprising metal and functionalized by said self-assembled monolayers of said layer for collecting charge carriers of the first type.

Notably, the self-assembled monolayers of the layer for collecting charge carriers of the first type functionalize the nanowires of said layer for collecting charge carriers of the first type so as to modify the work function of the material forming said nanowires.

According to an implementation, the charge carriers of the first type are holes, and the self-assembled monolayers of the layer for collecting charge carriers of the first type comprise 1H,1H,2H,2H-perfluorodecanethiol, or 2H-perfluorooctanethiol, or pentafluorobenzenethiol.

In particular, the nanowires of the layer for collecting charge carriers of the first type are silver, nickel, gold, copper or ITO nanowires.

According to an embodiment, the layer for collecting charge carriers of the first type comprises PVDF-TrFe.

Furthermore, the second electrode may comprise a layer for collecting charge carriers of the second type comprising self-assembled monolayers, and nanowires comprising metal and functionalized by said self-assembled monolayers of said layer for collecting charge carriers of the second type.

According to an embodiment, the charge carriers of the second type are electrons, and the self-assembled monolayers of the layer for collecting charge carriers of the second type comprise 2-methylthiophenol or 4-methylthiophenol.

Notably, the nanowires of the layer for collecting charge carriers of the second type are silver, nickel, gold, copper or ITO nanowires.

According to an embodiment, the charge carriers of the first type are electrons and the self-assembled monolayers of the layer for collecting charge carriers of the first type comprise 2-methylthiophenol or 4-methylthiophenol.

The invention also relates to a method for manufacturing a photodetector as described, this method comprises a step of providing a solution comprising a solvent and intended to be deposited to form the layer for collecting charge carriers of the first type, a step of depositing the solution, and a step of heat treatment of the deposited solution to evaporate the solvent.

In particular, the method may comprise a step of forming the active layer, preferably comprising P3HT and PCBM, and the solution is deposited, notably by screen-printing, on the active layer after the formation thereof, said solvent being chosen from ethanol, isopropanol, methoxyethanol, methanol, ethylene glycol, cyclopentanone, and gamma-butyrolactone, and the self-assembled monolayers functionalizing the nanowires of said solution comprising 2H-perfluorooctanethiol, or 1H,1H,2H,2H-perfluorodecanethiol, or pentafluorobenzenethiol.

The method may also comprise a step of preparing the solution to be provided comprising the following steps: a step of forming a mixture comprising the solvent, nanowires comprising metal, a product intended to form self-assembled monolayers at the surface of the nanowires, a step of heat treatment of the mixture during which said mixture is stirred so as to enable the grafting of the product onto the nanowires to form the nanowires functionalized by self-assembled monolayers.

The invention also relates to an electrode for a photodetector comprising a charge carrier collection layer for, notably intended to come into contact with, an active layer of said photodetector, said charge carrier collection layer comprising nanowires functionalized by self-assembled monolayers.

BRIEF DESCRIPTION OF THE FIGURES

The invention will be better understood on reading the description which follows, given solely by way of nonlimiting example and with reference to the drawings, in which.

In these figures, the same references are used to denote the same elements.

Furthermore, the elements represented in the figures are not to scale.

DESCRIPTION OF PARTICULAR EMBODIMENTS

The photodetector described below differs from the photodetectors of the prior art in that it proposes to use a charge carrier collection layer comprising nanowires comprising metal, said nanowires being functionalized by self-assembled monolayers so as to adapt the work function of the nanowires to that of the active layer.

An active layer within the meaning of the present description is a layer that makes it possible to generate charge carriers—for example holes and/or electrons—when it is subjected to electromagnetic radiation such as light or light energy. The active layer may be organic owing to the material that forms it, this being notably the case when the photodetector is an organic photodiode.

A self-assembled monolayer—also referred to as a self-assembled monoatomic layer—conventionally denoted by SAM for "self-assembled monolayer" may be formed from an assembly of molecules. The thickness of the self-assembled monolayer is generally that of its assembly, notably that of its assembly of molecules. In particular, the SAM may have a thickness of the order of 1 nm or ranging from 0.3 nm to 0.6 nm.

In the present description, the transparency of an element or of a layer to electromagnetic radiation is understood to mean that this layer is transparent to the latter, notably to the associated light/light energy that the photodetector may absorb to generate charge carriers. Typically, the layer (or element) is said to be transparent to electromagnetic radiation under consideration when it lets through more than 60%, or even more than 80% of the energy of this electromagnetic radiation. In particular, here the transparency of a layer comprising functionalized nanowires is imparted by the inter-nanowire spaces, it is therefore understood that the density of the nanowires is adapted as a function of the desired transparency, notably greater than or equal to the threshold mentioned above. Typically, the electromagnetic radiation under consideration here has a wavelength between 150 nm and 1500 nm. Preferably, in the description that will follow, the first and/or second electrodes are transparent to the electromagnetic radiation intended to be absorbed by the active layer to generate charge carriers.

Figure 1:
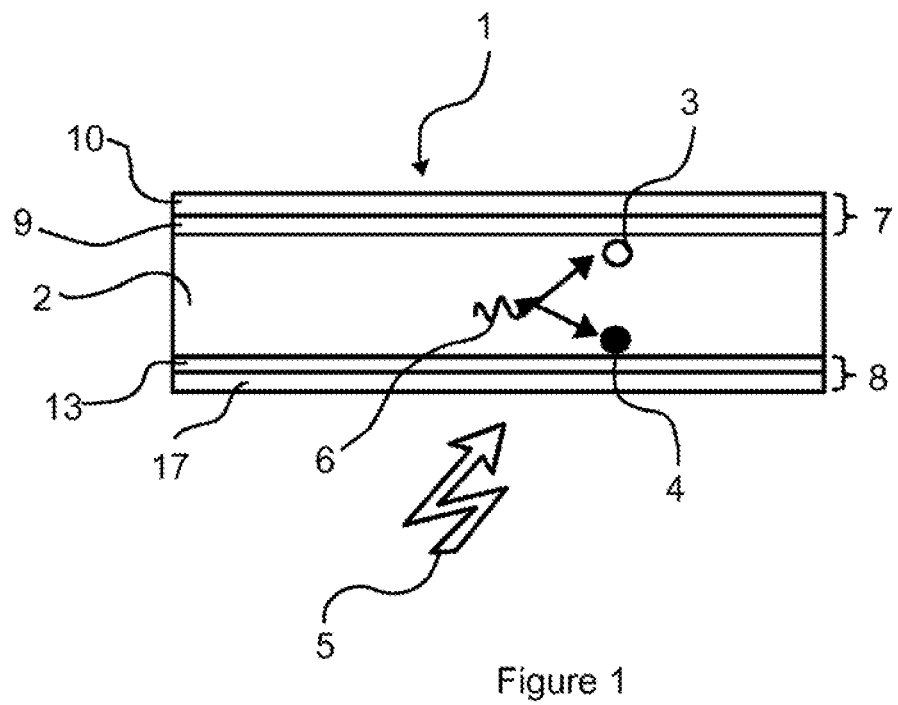
FIG. 1 schematically illustrates a photodetector according to a particular embodiment of the invention, FIG. 2 schematically illustrates a portion of the layer for collecting charge carriers of the first type comprising nanowires functionalized by self-assembled monolayers.

FIG. 1 schematically illustrates a photodetector 1, preferentially a photodiode notably which is organic, comprising an active layer 2 configured so as to generate charge carriers of a first type and of a second type (3, 4) by absorption of the electromagnetic radiation 5, notably of photons 6 from the electromagnetic radiation 5.

The active layer 2 may, for example, be organic. This active layer 2 may comprise a nanostructured mixture of p-type and n-type semiconductors as described in the document "High-efficiency solution processable polymer photovoltaic cells by self-organization of polymer blends" by Li G. et al. published in *Nature Materials*, vol. 4, November 2015, pages 864-868. The active layer 2 is preferentially made of P3HT-PCBM, it is said that the active layer 2 comprises P3HT and PCBM or that the active layer 2 is a mixture of P3HT and PCBM. The active layer 2 may also be a nanostructured mixture between an electron-donor material (poly(3-hexylthiophene regioregular, known under the name P3HT RR) and an electron-acceptor material (di[1,4]methanonaphthaleno[1,2:2',3',56,60:2",31"][5,6]fullerene-$C_{60}$-Ih, known under the name ICBA or PCMB of $C_{60}$ type) with a weight ratio of 1:2. According to yet another embodiment, this active layer 2 may also be a nanostructured mixture between an electron-donor material (poly[(4,8-bis (2-ethylhexyloxy)benzo(1,2-b:4,5-b')dithiophene)-2,6-diyl-alt-(4-(2-ethylhexanoyl)thieno[3,4-b]thiophene)-2-6-diyl)], known as PBDTTT-C) and an electron acceptor material ([6,6]-phenyl-$C_{71}$-butyric acid methyl ester, known under the name [70]PCBM or PCBM of $C_{70}$ type (this $C_{70}$ type being an optimization of $C_{60}$ since it is more stable) with a weight ratio of 1:2. Notably, the active layer 2 preferentially has a thickness between 150 nm and 450 nm and notably equal to 300 nm. In fact, the active layer 2 is preferentially a mixture of an electron donor polymer (for example P3HT) and an electron acceptor fullerene (for example PCBM).

Furthermore, the photodetector 1 comprises a first electrode 7 capable of collecting the charge carriers of the first type and a second electrode 8 capable of collecting the charge carriers of the second type. The first electrode 7 comprises a layer 9 for collecting charge carriers of the first type comprising self-assembled monolayers and nanowires comprising metal. These nanowires of the layer 9 for collecting charge carriers of the first type 3 are functionalized by said self-assembled monolayers of said layer 9 for collecting charge carriers of the first type. The layer 9 for collecting charge carriers of the first type is preferentially in contact with the active layer 2. Notably, the self-assembled monolayers of the layer 9 for collecting charge carriers of the first type functionalize the nanowires of said layer 9 for collecting charge carriers of the first type so as to modify the work function of the material forming said nanowires (i.e. modify the work function of the material that said nanowires comprise or else modify the work function of the nanowires), this material comprising at least the metal targeted previously. This layer 9 for collecting charge carriers of the first type may be such that the functionalized nanowires have a density such that the criterion of transparency of the collection layer 9 to electromagnetic radiation is respected. The first electrode 7 may also comprise a layer 10 for transporting charge carriers of the first type, this layer 10 being in contact with the layer 9 for collecting charge carriers of the first type. The presence of this transport layer 10 is not necessary, it may therefore be removed if need be, for example to limit the costs or avoid certain problems of compatibility between materials. In the case of the presence of the transport layer 10, the latter is such that it is not in direct contact with the layer 2. Generally, the first electrode 7 is preferentially transparent to the electromagnetic radiation intended to be absorbed by the active layer 2. The layer 9 for collecting charge carriers of the first type may have a thickness between 10 nm and 100 nm, and the total thickness of the first electrode 7 may be between 10 nm and 100 nm.

Generally, the charge carriers of the first type and of the second type are chosen from electrons 4 and holes 3. In the case where the first electrode 7 is an anode, the charge carriers of the first type are holes and the self-assembled monolayers of the layer 9 for collecting charge carriers of the first type are configured so as to increase the work function (to tend toward 5.1 eV or more) of the nanowires of the layer 9 for collecting charge carriers of the first type. In the case where the first electrode 7 is a cathode, the charge carriers of the first type are electrons 4 and the self-assembled monolayers of the layer 9 for collecting charge carriers of the first type are configured so as to decrease the work function (to tend toward 4.3 eV or less) of the nanowires of the layer 9 for collecting charge, carriers of the first type.

Figure 2:
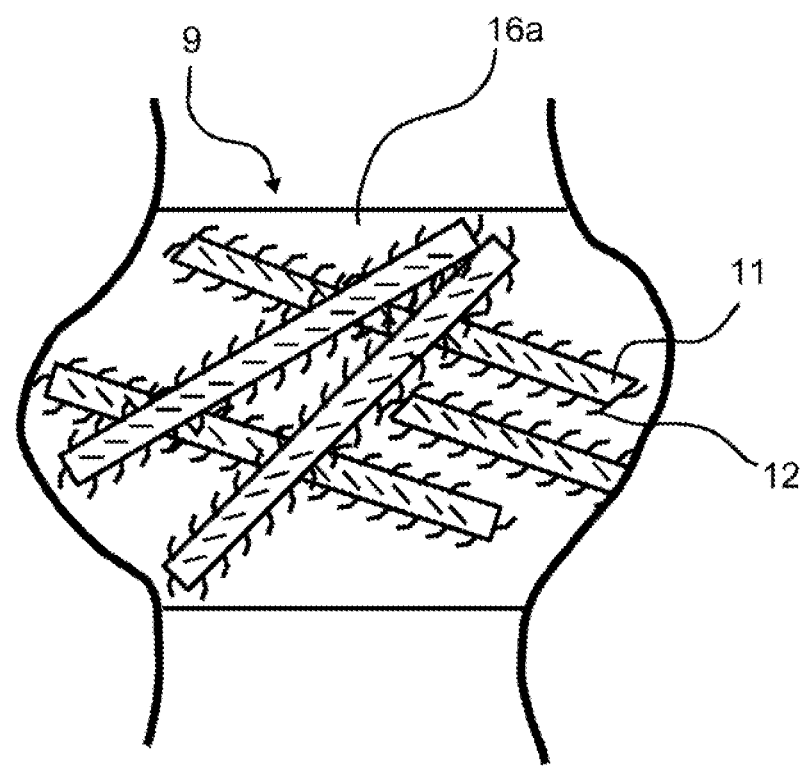

FIG. 2 illustrates a portion of the layer 9 for collecting charge carriers of the first type and shows nanowires 11 functionalized by self-assembled monolayers 12. The collection layer 9 comprises a plurality of entangled nanowires 11 each functionalized by at least one associated self-assembled monolayer 12. In fact, for each nanowire 11 functionalized with at least one self-assembled monolayer 12, the self-assembled monolayer is said to be grafted to the metal of the associated nanowire 11. Notably, each nanowire 11 is functionalized by several self-assembled monolayers 12 which are grafted to said nanowire 11. In particular, the self-assembled monolayers 12 functionalizing a nanowire 11 are such that they cover the entire surface of the corresponding nanowire. Certain self-assembled monolayers may be brought into contact owing to the entanglement of the nanowires. The covering thickness of a nanowire may be of the order of the sum of that which belongs to the self-assembled monolayer and that extends from the nanowire, notably it is the dimension of the assembly of molecules of the self-assembled monolayer along the direction corresponding to the covering thickness.

In the present description, a nanowire is an elongated, or longilineal, nanoobject, notably obtained by growth or by etching, it may have a length between 50 nm and 30 μm (notably of the order of 10 μm) and lateral dimensions—taken in a cross-sectional plane perpendicular to the elongation of the nanowire—between 5 nm and 100 nm (notably of the order of 10 nm).

In the present description, when a dimension is associated with the terms "of the order of" exactly this dimension, or this dimension plus or minus 10%, is understood.

Figure 3:
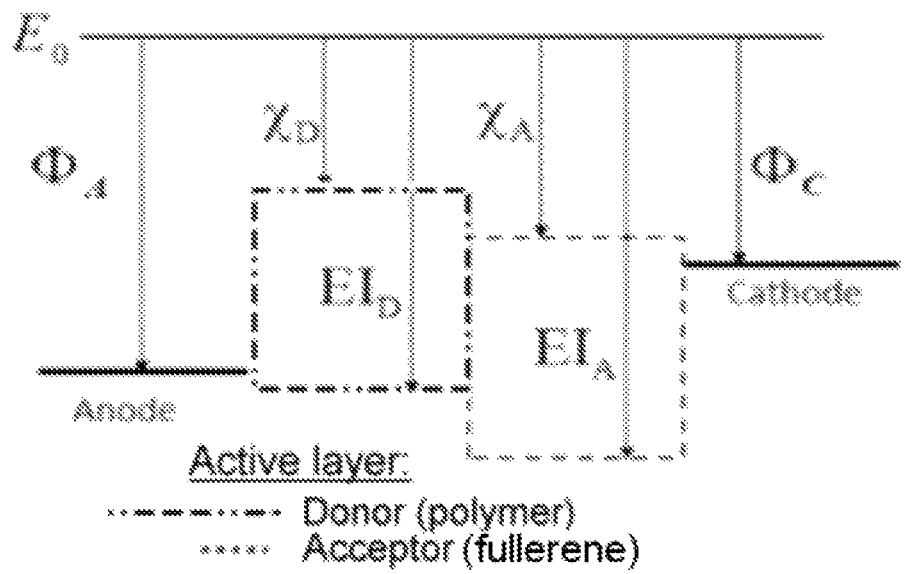
FIG. 3 illustrates a band diagram.

The nanowires comprising metal that are targeted in the present description may be silver, gold, copper, nickel or ITO (indium tin oxide) nanowires. In other words, the nanowires comprising metal may be such that said metal is chosen from: silver, gold, copper, nickel and ITO. Alone, they have a work function between 4.3 eV and 4.6 eV, which is insufficient to guarantee the proper operation of the photodetector from the electrical viewpoint. As a matter of fact, on the anode side where it is sought to collect the holes, a work function, the minimum of which is 5.1 eV is preferentially required, and on the cathode side, where it is sought to collect the electrons, a work function of at most 4.2 eV is required, this being true notably for any type of active layer cited in the present description. In other words, the active layer 2 is preferentially configured so that the work function of the anode to be associated therewith is greater than or equal to 5.1 eV and so that the work function of the cathode to be associated therewith is at most 4.2 eV to obtain a good collection efficiency for the charge carriers of the first type and of the second type. FIG. 3 illustrates an ideal band diagram for the structure of a photodiode composed of a cathode, the electron donor, the electron acceptor and the anode in which the active layer comprises the electron donor formed by a polymer and the electron acceptor formed by a fullerene. In this FIG. 3, the work function of the cathode and of the anode is defined as the energy difference between the Fermi level of the contact (anode or cathode) and the vacuum level $E_0$, $\Phi_A$ for the anode and $\Phi_C$ for the cathode. The electron affinity of the polymer and of the fullerene is defined as the energy difference between the LUMO and the vacuum level whilst their ionization energy is defined as the energy difference between the HOMO and the vacuum level. In this FIG. 3, $\chi_A$ represents the energy difference between the LUMO of the electron acceptor and the vacuum level, $\chi_D$ represents the energy difference between the LUMO of the electron donor and the vacuum level, $EI_D$ represents the ionization energy of the electron donor, and $EI_A$ represents the ionization energy of the electron acceptor. It is from this diagram that it results that the electron collection layer must preferentially have a work function less than or equal to 4.2 eV and that the hole collection layer must preferentially have a work function greater than or equal to 5.1 eV, this being valid for the active layers cited in the present description.

By appropriately choosing, notably the molecules used for forming the self-assembled monolayers functionalizing the nanowires, it is possible to finely adjust the work function of the nanowires and more generally of the layer 9 for collecting charge carriers of the first type.

In a first case, the charge carriers of the first type are holes 3 and the self-assembled monolayers belonging to the layer 9 for collecting charge carriers of the first type comprise, i.e. notably each comprise, 2H-perfluorooctanethiol (also known under the name PFOT), or pentafluorobenzenethiol (also known under the name PFBT), or 1H,1H,2H,2H-perfluorodecanethiol (also known under the name PFDT). PFOT, PFDT, and PFBT may be generalized, where appropriate, to the thiol (R-SH) family and to the dithiol (HS-R-SH) family. The nanowires 11 of the layer 9 for collecting charge carriers of the first type may be as described above. For silver nanowires, the self-assembled monolayers comprise, or are preferably made of, pentafluorobenzenethiol of formula $C_6HF_5S$. It is then understood that the layer 9 for collecting charge carriers of the first type may replace the PEDOT:PSS commonly used in the prior art, and very particularly within the context of an inverted architecture where this layer 9 for collecting charge carriers of the first type is intended to be formed, notably by deposition, on the active layer 2 while avoiding degrading it, as PEDOT:PSS would do. For this, use is made, during the formation of the collection layer 9, of a solvent compatible with the active layer 2 (in particular when the latter is made of, or comprises P3HT-PCBM), such a solvent can be ethanol, isopropanol, methoxyethanol, methanol, ethylene glycol, cyclopentanone, or gamma-butyrolactone. Moreover, this layer 9 for collecting charge carriers of the first type is also advantageous in the sense that it is not as sensitive to moisture as PEDOT:PSS, thus avoiding the formation of an acid.

In a second case, the charge carriers of the first type are electrons and the self-assembled monolayers of the layer 9 for collecting charge carriers of the first type comprise, i.e. notably each comprise, 2-methylthiophenol (also known under the name 2MTP) or 4-methylthiophenol (also known under the name 4MTP). This second case allows an alternative to the ZnO or TiOx used in the prior art. This is advantageous notably in the context of replacing ZnO which is not stable since it has a photoconduction and a work function dependent on the illumination which disrupts the reproducibility of the photodetectors. The nanowires 11 may be made of one of the metals targeted above. For example, for silver nanowires, their work function is typically between 4.6 eV and 4.7 eV, by grafting 4MTP onto the silver nanowires, it is possible to form an electron collection layer having a work function of the order of 4 eV, and by grafting 2MTP onto the silver nanowires, it is possible to form an electron collection layer 9 having a work function of the order of 3.8 eV.

Preferentially, in the first and second cases, the collection layer 9 is formed so that the transport layer 10 is not in contact with the active layer 2 since if this is not the case, the contact between the transport layer 10 and the active layer 2 may lead to problems of transparency and problems with respect to the work function. In this sense, the collection layer 9 may cover the transport layer 10 if it is formed after the transport layer 10.

Generally, when the transport layer 10 is present—its presence not being necessary—it is chosen to be compatible with the collection layer 9. According to an example, within the context of hole transport, the transport layer 10 may be made of gold, palladium or platinum, and its thickness may be between 5 nm and 10 nm. According to another example, within the context of electron transport, the transport layer 10 may be made of aluminum or copper, and its thickness may be between 5 nm and 10 nm.

In the first and second cases, the thickness of the collection layer 9 is preferentially at most 100 nm so as to retain a good transparency.

Figure 4:
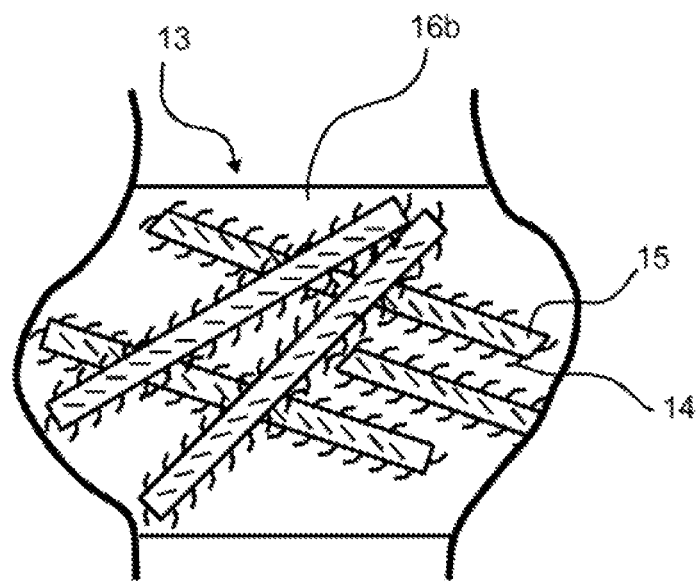
FIG. 4 schematically illustrates a portion of the layer for collecting charge carriers of the second type comprising nanowires functionalized by self-assembled monolayers, FIG. 5 schematically illustrates a photodetector equipped with hole-blocking and electron-blocking layers.

In a third case, the photodetector 1 may be such that it comprises a hole collection layer based on nanowires comprising metal and functionalized by self-assembled monolayers and an electron collection layer based on nanowires comprising metal and functionalized by self-assembled monolayers. This third case corresponds notably to the features of the first case associated with the following features (FIG. 1): the second electrode 8 comprises a layer 13 for collecting charge carriers of the second type comprising self-assembled monolayers 14, and nanowires 15 (FIG. 4) comprising metal and functionalized by said self-assembled monolayers 14 of said layer 13 for collecting charge carriers of the second type. In this third case, the nanowires of the collection layer 13 functionalized by the self-assembled monolayers 14 may be functionalized in the manner described previously in relation to FIG. 2: in other words, the collection layer 13 may comprise a plurality of entangled nanowires 15 each functionalized by at least one associated self-assembled monolayer 14. In fact, for each nanowire 15 functionalized with at least one self-assembled monolayer 14, the self-assembled monolayer 14 is said to be grafted to the metal of the associated nanowire 15. Notably, each nanowire 15 is functionalized by several self-assembled monolayers 14 which are grafted to said nanowire 15. In particular, the self-assembled monolayers 14 of the layer 13 for collecting charge carriers of the second type functionalize the nanowires 15 of said layer 13 for collecting the charge carriers of the second type so as to modify the work function of the material forming said nanowires 15 (i.e. modify the work function of the material which comprises said nanowires or else modify the work function of the nanowires), this material comprising at least the metal targeted above. The layer 13 for collecting charge carriers of the second type is preferentially in contact with the active layer 2. Here, preferentially the charge carriers of the second type are electrons and the self-assembled monolayers of the layer 13 for collecting charge carriers of the second type comprise, i.e. notably each comprise, 2-methylthiophenol or 4-methylthiophenol. In this third case, the thicknesses of the layers forming the second electrode may be the same as those targeted for the first electrode. Furthermore, the nanowires comprising metal may be as described above. The second electrode 8 may also comprise a layer 17 for transporting charge carriers of the second type. The presence of this layer 17 for transporting charge carriers of the second type is not necessary, it may therefore be removed if need be, for example to limit the costs or avoid certain problems of compatibility between materials. Generally, when the transport layer 17 of the second electrode is present, it is chosen to be compatible with the collection layer 13. According to an example, within the context of hole transport, the transport layer 17 may be made of gold, palladium or platinum, and its thickness may be between 5 nm and 10 nm. According to another example, within the context of electron transport, the transport layer 17 may be made of aluminum or copper, and its thickness may be between 5 nm and 10 nm. For the same reasons as above, preferentially, the collection layer 13 is formed so that the transport layer 17 is not in contact with the active layer 2.

Regarding the layer 9 for collecting charge carriers of the first type and/or where necessary the layer 13 for collecting charge carriers of the second type, the latter may be formed in various ways.

According to an embodiment, the layer 9 for collecting charge carriers of the first type and/or where necessary the layer 13 for collecting charge carriers of the second type comprise only nanowires comprising metal and functionalized by corresponding self-assembled monolayers. Here, the collection layer 9 and/or the collection layer 13 are preferentially directly in contact with the active layer 2. Although this embodiment is preferred, it may give rise to problems of adhesion of the collection layer to the active layer.

According to another embodiment, the collection layer 9 and/or the collection layer 13 may comprise an additional material (referenced 16a for the collection layer 9 in FIG. 2 and referenced 16b for the collection layer 13 of FIG. 4) making it possible to bind the functionalized nanowires together, notably by coating. Thus, in a manner that can be applied to the first, second or third cases, the layer 9 for collecting charge carriers of the first type and/or where necessary the layer 13 for collecting charge carriers of the second type may comprise PVDF-TrFe 16a, 16b (FIGS. 2 and 4) which is the abbreviation for poly(vinylidene fluoride-trifluoroethylene) copolymer, this is in fact a copolymer. In the first, second or third cases, this copolymer coats the functionalized nanowires. This copolymer is particularly suitable for coating functionalized nanowires since it enables, on the one hand, a transfer of charges (electrons or holes) from nanowires to nanowires via a capacitive and electrostatic mechanism and, on the other hand, to retain a transparency such that the electromagnetic radiation intended to generate charge carriers in the active layer 2 can pass through said layer 9 for collecting charge carriers of the first type and/or where necessary the layer 13 for collecting charge carriers of the second type. When the layer 9 for collecting charge carriers of the first type is an electron collection layer comprising the nanowires functionalized by said self-assembled monolayers, these functionalized nanowires may be coated/dispersed in PCBM: this material is very particularly suitable since it is a negative charge carrier. Where necessary, when the layer 13 for collecting charge carriers of the second type is an electron collection layer, the functionalized metallic nanowires of said layer 13 for collecting charge carriers of the second type may be coated/dispersed in PCBM. When the layer 9 for collecting charge carriers of the first type is a hole collection layer comprising the nanowires functionalized by said self-assembled monolayers, these functionalized nanowires may be coated/dispersed in P3HT: this material is very particularly suitable since it is a positive charge carrier. Where necessary, when the layer 13 for collecting charge carriers of the second type is a hole collection layer, the functionalized metallic nanowires of said layer 13 for collecting charge carriers of the second type may be coated/dispersed in P3HT. One advantage of using the PCBM material within the layer for collecting charge carriers of electron type (where necessary layer 9 or 13) is that the PCBM will enable a hole-blocking function to improve the electron-collecting function. One advantage of using the P3HT material within the layer for collecting charge carriers of hole type (where necessary layer 9 or 13) is that the P3HT will enable an electron-blocking function to improve the hole-collecting function. Preferentially, the layer for collecting charge carriers of electron type may be such that it comprises a slice made of PCBM (notably having a thickness between 5 nm and 30 nm and preferentially equal to 10 nm) free of functionalized nanowires at its interface with the active layer 2: this making it possible to block the holes more easily. Furthermore, the layer for collecting charge carriers of hole type may be such that it comprises a slice made of P3HT (notably having a thickness between 5 nm and 30 nm and preferentially equal to 10 nm) free of functionalized nanowires at its interface with the active layer 2: this making it possible to block the electrons more easily.

The coating of the functionalized nanowires, whether this is within the context of the layer 9 for collecting charge carriers of the first type, or where necessary within the context of the layer 13 for collecting charge carriers of the second type, has an advantage during the manufacture of the photodetector in the sense that this makes it possible to separate the layers and to prevent a material deposited on said collection layer in question from flowing between the functionalized nanowires.

Figure 5:
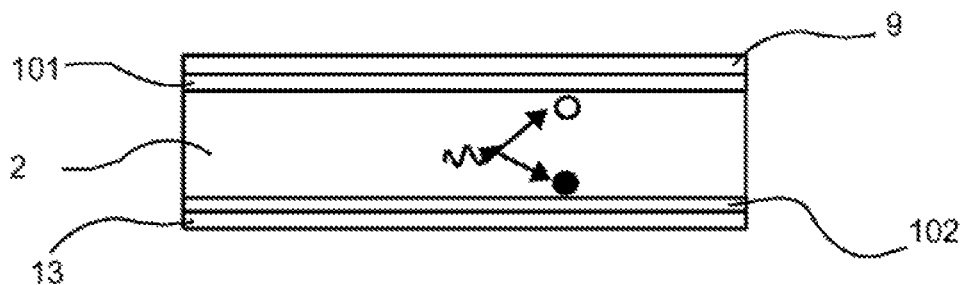

According to a particular implementation applicable to the various embodiments of the photodetector described presently, the photodetector may comprise (FIG. 5) a layer for blocking charge carriers of the second type 101 interposed between the active layer 2 and the layer 9 for collecting charge carriers of the first type and/or a layer for blocking charge carriers of the first type 102 interposed between the layer 13 for collecting charge carriers of the second type and the active layer 2. Notably, when the charge carriers of the first type are holes, the layer for blocking charge carriers of the second type is an electron blocking layer, notably made of, or comprising, P3HT. Notably, when the charge carriers of the second type are electrons, the layer for blocking charge carriers of the second type is a hole blocking layer, notably made of, or comprising, PCBM. The blocking layers make it possible to improve the operation of the device by preventing the collection of the wrong charge carriers at a given electrode. Notably, the blocking layers mentioned here are transparent to the electromagnetic radiation 5 and have a thickness of 10 nm or more generally between 2 nm and 30 nm.

Generally, the photodetector 1 may comprise a substrate on which a part of the photodetector 1 is formed. This substrate is typically transparent to the light energy, and may be made of glass, polyethylene naphtholate (PEN) or polyethylene terephthalate (PET). The substrate may have a thickness between 100 μm and 125 μm.

Figure 6:
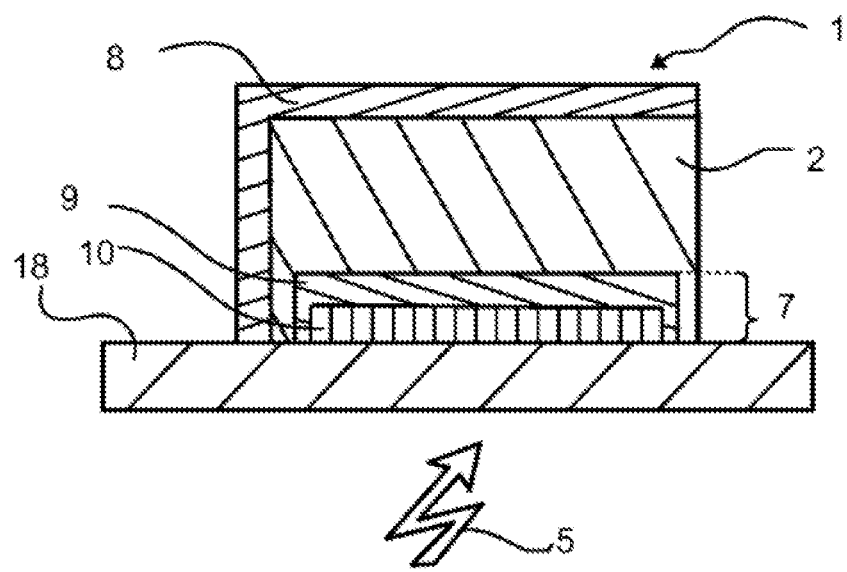
FIGS. 6 and 7 illustrate, in cross section, two possible photodetector architectures.

FIG. 6 illustrates a particular example of a photodetector 1 seen in cross section comprising a substrate 18 transparent to the electromagnetic radiation 5 on which is arranged a stack comprising the first electrode 7, then forming an anode, having its hole transport layer 10 extending from the substrate 18, and having the layer 9 for collecting charge carriers of the first type (holes). Preferentially, the hole collection layer 9 covers the hole transport layer 10 so that the active layer 2 does not come into contact with the hole transport layer 10. The active layer 2 is then arranged on this first electrode 7 and may cover it, the layer 9 for collecting charge carriers of the first type then being in contact with this active layer 2 which may extend from the substrate 18. Lastly, the second electrode 8, forming a cathode 8 is arranged at least partly at the top of the stack. Here the cathode 8 is represented as a single layer but it could be formed of several layers in order, for example, to comprise the layer for collecting charge carriers of the second type as described previously and also an electron transport layer which preferentially would not be in contact with the active layer 2. This architecture is also known under the name of direct architecture. In this type of direct architecture, the photodetector 1 is illuminated through the substrate 18.

Figure 7:
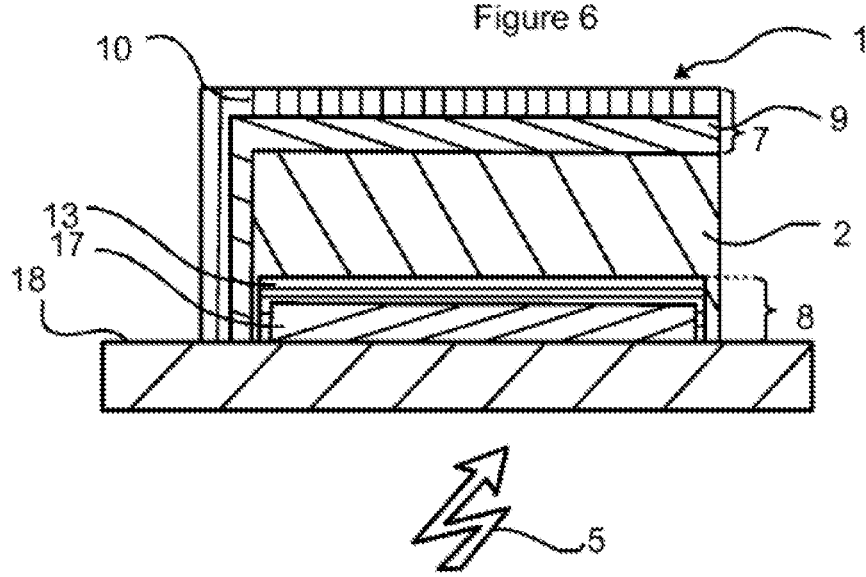

FIG. 7 illustrates another particular example of a photodetector 1 seen in cross section comprising the substrate 18 transparent to the electromagnetic radiation 5 on which is arranged a stack comprising the second electrode 8, then forming a cathode, having its electron transport layer 17 extending from the substrate 18, and having the layer 13 for collecting charge carriers of the second type (electrons). Preferentially, the electron collection layer 13 covers the electron transport layer 17 so that the active layer 2 does not come into contact with the transport layer 17. The active layer 2 is then arranged on this second electrode 8 and may cover it, the collection layer 13 then being in contact with this active layer 2 which may extend from the substrate 18. Lastly, the anode 7 is arranged at the top of the stack. Here the anode comprises the layer 9 for collecting charge carriers of the first type (with functionalized nanowires) in contact with the active layer 2, and also the hole transport layer 10. Here the layers 9 and 10 are preferentially arranged so that the layer 10 is not in contact with the active layer 2. This architecture is also known under the name of inverted architecture. In this type of inverted architecture, the photodetector is illuminated through the substrate 18.

Figure 8:
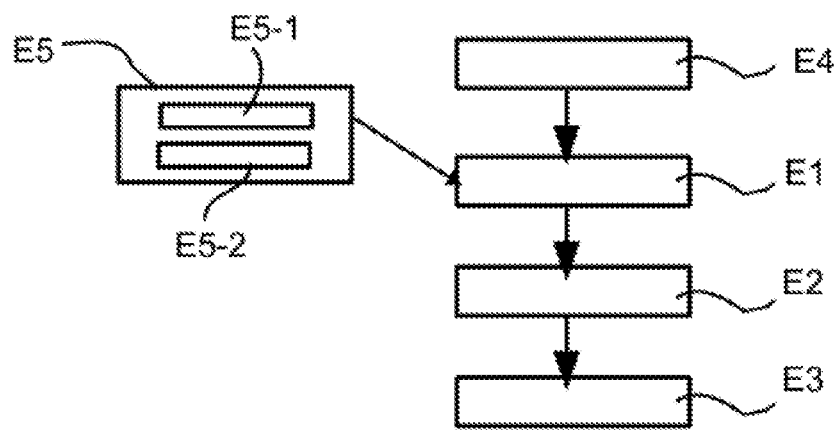
FIG. 8 illustrates steps of a method for manufacturing a photodetector according to a particular embodiment of the invention.

The invention also relates to a method for manufacturing a photodetector as described. Notably, the method comprises (FIG. 8) a step E1 of providing a solution comprising a solvent and nanowires functionalized by self-assembled monolayers. This solution is intended to be deposited to form the layer 9 for collecting charge carriers of the first type. It is then understood that the method comprises a step E2 of depositing the solution, then a step E3 of heat treatment of the deposited solution to evaporate the solvent which results in the obtaining of the charge carrier collection layer 9 as described. The temperature applied for the heat treatment in order to evaporate the solvent may be adapted by those skilled in the art, it may be an annealing at 120° C. for example for 10 min to 30 min.

The method may also comprise a step E4 of forming the active layer 2, notably by deposition. Furthermore, the charge carriers of the first type being holes, the step E2 of depositing the solution 2 is preferentially carried out on the active layer 2, notably as a replacement for the PEDOT:PSS of the prior art, this results in the formation of a hole collection layer that does not have the drawbacks of the prior art. In other words, the method may comprise the step E4 of forming the active layer 2, preferably comprising P3HT and DCBM, and the solution is deposited (notably by screen-printing or by coating) on the active layer 2 after the formation thereof, said solvent being chosen from ethanol, isopropanol, methoxyethanol, methanol, ethylene glycol, cyclopentanone, and gamma-butyrolactone, and the self-assembled monolayers functionalizing the nanowires of said solution comprising, i.e. notably each comprising, 2H-perfluorooctanethiol, or 1H,1H,2H,2H-perfluorodecanethiol, or pentafluorobenzenethiol.

The method may comprise a step E5 of preparing the solution to be provided comprising the following steps: a step E5-1 of forming a mixture comprising the solvent, nanowires comprising metal, a product intended to form self-assembled monolayers at the surface of the nanowires, and a step E5-2 of heat treatment of the mixture during which said mixture is stirred so as to enable the grafting of the product onto the nanowires to form the nanowires 11 functionalized by self-assembled monolayers 12. The stirring of the mixture during the step E5-2 of heat treatment of the mixture enables the nanowires to remain independent of one another, as a matter of fact it was observed that in the event of absence of stirring of the mixture, the nanowires had a tendency to form aggregates detrimental to the future formation of the associated charge carrier collection layer. Preferably, for a volume of 2 ml, the stirring is carried out at 600 rpm (or 600 revolutions per minute). In the case where the charge carriers of the first type are holes, the product may comprise 2H-perfluorooctanethiol, or pentafluorobenzenethiol, or 1H,1H,2H,2H-perfluorodecanethiol (in an amount suitable for forming self-assembled monolayers) and the solvent may be chosen from ethanol, isopropanol, methoxyethanol, methanol, ethylene glycol, cyclopentanone, and gamma-butyrolactone. In the case where the charge carriers of the first type are electrons, the product may comprise 2MTP or 4MTP (in an amount suitable for forming self-assembled monolayers) and the solvent may be chosen from ethanol, isopropanol, methoxyethanol, methanol, ethylene glycol, cyclopentanone, and gamma-butyrolactone.

Before forming the mixture, the nanowires may undergo an $H_2$ plasma treatment, this makes it possible to remove traces of oxide at the surfaces thereof to subsequently facilitate the grafting of the self-assembled monolayers onto said nanowires.

Notably, the mixture formed is such that it comprises, for one volume of the product intended to form the self-assembled monolayers, a thousand volumes of solvent. The number of nanowires in the mixture will be chosen so that the future collection layer formed remains transparent in the manner as described previously. More generally, it is considered that 1 ml of product intended to form the self-assembled monolayers is required per 1 liter of solvent for the purpose of creating an attachment, of the self-assembled monolayers without too much residue not grafted to the nanowires.

The step E5-2 of heat treatment of the mixture to form the solution to be deposited may comprise maintaining the mixture at 120° C. for 1 hour, notably when the nanowires are made of silver and when the product is, or comprises, pentafluorobenzenethiol. Preferentially, when the product is/comprises pentafluorobenzenethiol the solvent used is methanol or isopropanol alcohol, although the other solvents also work. In particular, the mixing temperature and time are also adapted for the various metals targeted and the various SAMs targeted.

Furthermore, before depositing the solution, but after the heat treatment step E5-2, when necessary the copolymer mentioned above, or where necessary PCBM or else P3HT may be added to this solution. Within the context of the copolymer of PVDF-TrFe type, the solution is constituted by PVDF-TrFe in proportions ranging from 1% to 30% by weight of the solution. The copolymer is then added after the heat treatment step before the deposition of the solution. Preferably, within the context of the use of PVDF-TrFe, the solvent used for grafting the self-assembled monolayers to the nanowires may be cyclopentanone or gamma-butyrolactone which are also solvents of PVDF-TrFe.

It has been described above how to form the layer 9 for collecting charge carriers of the first type from a suitable solution. The same principle may be adapted when it is desired to form the layer for collecting charge carriers of the second type as the latter also comprises nanowires functionalized by self-assembled monolayers.

The method described may be carried out to form a photodetector, notably an organic photodiode, according to a direct architecture or an inverted architecture starting from a substrate. Notably, the substrate is transparent to the energy of the light intended to be absorbed by the active layer. The substrate may be of the type as described above.

In direct architecture, the method may comprise (FIG. 6) a step of providing a substrate 18 transparent to the electromagnetic radiation 5 intended to be absorbed by the active layer 2, a step of forming the first electrode 7, transparent to the electromagnetic radiation 5 intended to be absorbed by the active layer 2, provided with a hole transport layer 10 in contact with the substrate 18 and the layer 9 for collecting charge carriers of the first type. Here, the charge carriers of the first type are holes and the collection layer 9 is formed on the hole transport layer 10. Next, the method may comprise the step of forming the active layer 2 then in contact with the hole collection layer 9. Lastly, the method may comprise the step of forming the second electrode 8 (then forming a cathode) on the previously deposited active layer 2.

In inverted architecture (FIG. 7) the method may comprise a step of providing a substrate 18 transparent to the electromagnetic radiation 5 intended to be absorbed by the active layer 2, a step of forming the second electrode 8, transparent to the electromagnetic radiation 5 intended to be absorbed by the active layer 2. This second electrode 8 may comprise an electron transport layer 17 in contact with the substrate 18 and the layer 13 for collecting charge carriers of the second type. Here, the charge carriers of the second type are electrons and the collection layer 13 is formed on the electron transport layer 17. Next, the method may comprise the step of forming the active layer 2 then in contact with the electron collection layer 13. Lastly, the method may comprise the step of forming the first electrode 7 on the previously deposited active layer 2. This first electrode 7 may comprise the layer 9 for collecting charge carriers of the first type (holes) as described above and deposited directly on the active layer 2, and finally the first electrode 7 may comprise a hole transport layer 10 deposited on the layer 9 for collecting charge carriers of the first type, and for example formed of silver.

Two variants of a method/device with inverted and direct architecture were generalized above. According to a particular example, notably with inverted architecture, the photodetector, notably obtained according to the method described previously may comprise a substrate transparent to the electromagnetic radiation intended to be absorbed by the active layer (made of glass, polyethylene naphthalate (PEN) or polyethylene terephthalate (PET)), the first and second electrodes and also the active layer interposed between the first and second electrodes. Formed on the substrate is the second electrode transparent to the electromagnetic radiation intended to be absorbed by the active layer (for example comprising a layer of tin-doped indium oxide forming the electron transport layer, and comprising an electron collection layer, for example made of ZnO (zinc oxide) or PEIE (abbreviation of ethoxylated polyethylenimine) or TiOx (titanium oxide). The active layer is then deposited on the second electrode. This active layer may for example be organic and comprise a nanostructured mixture of p-type and n-type semiconductors in its various variants described above. The first electrode may then be deposited on the active layer. The active layer may be deposited by coating in a solvent of mesitylene type, with a dry thickness of 300 nm after thermal annealing enabling the evaporation of the solvent. This dry thickness of the active layer makes it possible to prevent electrical leakages, i.e. this thickness guarantees a good isolation between the two electrodes of the photodetector. Preferentially, the active layer extends from the substrate and covers the second electrode notably on the sidewalls thereof and on the face thereof opposite the substrate. The active layer 2 may also be deposited by spray coating in a solvent of chlorobenzene type, with a dry thickness of 800 nm after thermal annealing enabling the evaporation of the solvent.

The collection layer comprising the functionalized nanowires may be deposited by screen-printing.

The invention also relates to an electrode 7, 8 for a photodetector comprising a charge carrier collection layer 9, 13 for, notably intended to come into contact with, an active layer 2 of said photodetector, said charge carrier collection layer 9, 13 comprising nanowires functionalized by self-assembled monolayers.

In the present description, everything which was stated within the context of the method or of the photodetector may be applied to the electrode. Furthermore, everything which was stated within the context of the method may be applied to the photodetector or vice versa.

Thus, the electrode 7, 8 for a photodetector 1 may comprise a charge carrier collection layer 9, 13 for, notably intended to come into contact with, the active layer 2 of said photodetector 1. This charge carrier collection layer 9, 13 comprising the nanowires 11, 15 functionalized by self-assembled monolayers 12, 14. The self-assembled monolayers 12, 14 of the charge carrier collection layer 9, 13 functionalize the nanowires 11, 15 of said charge carrier collection layer 9, 13 so as to modify the work function of the material forming said nanowires 11, 15.

Preferably, the modification of the work function of the material of the nanowires by the self-assembled monolayers enables the charge carrier collection layer in question (first type, and where necessary second type) to have a work function suitable for the active layer 2. This makes it possible to guarantee a good operation of the photodetector. In particular, when the photodetector is a photodiode, a discrepancy of the work function between the electrode in question and the active layer may give rise to a great disturbance of the photodetector that may extend as far as the short-circuit caused by electronic leakages. It is in this sense that the layer 9 for collecting charge carriers of the first type of the first electrode 7, and where necessary the layer 13 for collecting charge carriers of the second type of the second electrode 8, preferentially have:
- an electrical conductivity sufficient to limit the series resistance of the photodetector notably when the latter is a photodiode,
- a work function suitable for the active layer,
- a stability to the deposition conditions used during the manufacture of the photodetector.

The invention claimed is:
1. A photodetector, comprising:
an active layer configured to generate charge carriers of a first type and of a second type by absorption of electromagnetic radiation;
a first electrode configured to collect the charge carriers of the first type; and
a second electrode configured to collect the charge carriers of the second type,
the first electrode comprising a layer configured to collect the charge carriers of the first type, the layer comprising:
self-assembled monolayers,
nanowires comprising metal and functionalized by the self-assembled monolayers of the layer, and
PVDF-TrFe, wherein the self-assembled monolayers of the layer are configured to functionalize the nanowires of the layer for collecting the charge carriers of the first type and to modify a work function of a material forming the nanowires.

2. The photodetector according to claim 1, wherein the charge carriers of the first type are holes, and wherein the self-assembled monolayers of the layer comprise 1H,1H,2H,2H-perfluorodecanethiol, or 2H-perfluorooctanethiol, or pentafluorobenzenethiol.

3. The photodetector according to claim 1, wherein the nanowires are silver, nickel, gold, copper, or indium tin oxide (ITO) nanowires.

4. The photodetector according to claim 1, wherein the second electrode comprises another layer configured to collect charge carriers of the second type, the another layer comprising:
   self-assembled monolayers, and
   nanowires comprising metal and functionalized by the self-assembled monolayers of the another layer.

5. The photodetector according to claim 4, wherein the charge carriers of the second type are electrons, and wherein the self-assembled monolayers of the another layer comprise 2-methylthiophenol or 4-methylthiophenol.

6. The photodetector according to claim 4, wherein the nanowires of the another layer are silver, nickel, gold, copper, or indium tin oxide (ITO) nanowires.

7. The photodetector according to claim 1, wherein the charge carriers of the first type are electrons, and wherein the self-assembled monolayers of the layer comprise 2-methylthiophenol or 4-methylthiophenol.

8. A method for manufacturing a photodetector according to claim 1, the method comprising:
   providing a solution comprising a solvent and configured to be deposited to form the layer for collecting the charge carriers of the first type;
   depositing the solution; and
   performing a heat treatment of the deposited solution to evaporate the solvent.

9. The method according to claim 8, further comprising forming the active layer, wherein the solution is deposited by screenprinting on the active layer after the forming thereof, wherein the solvent is chosen from ethanol, isopropanol, methoxyethanol, methanol, ethylene glycol, cyclopentanone, and gamma-butyrolactone, and wherein the self-assembled monolayers comprise 2H-perfluorooctanethiol, or 1H,1H,2H,2H-perfluorodecanethiol, or pentafluorobenzenethiol.

10. The method according to claim 9, wherein the active layer comprises P3HT and PCBM.

11. The method according to claim 8, further comprising preparing the solution according to the following steps:
   forming a mixture comprising the solvent, nanowires comprising metal, and a product configured to form self-assembled monolayers at a surface of the nanowires; and
   performing a heat treatment of the mixture during which the mixture is stirred so as to enable grafting of the product onto the nanowires to form the nanowires functionalized by the self-assembled monolayers.

12. An electrode for a photodetector, comprising:
   a charge carrier collection layer configured to come into contact with an active layer of the photodetector, the charge carrier collection layer comprising PVDF-TrFe and nanowires functionalized by self-assembled monolayers,
   wherein the self-assembled monolayers of the charge carrier collection layer are configured to functionalize the nanowires of the charge carrier collection layer and to modify a work function of a material forming the nanowires.

* * * * *